(12) United States Patent
Takakura et al.

(10) Patent No.: US 6,237,400 B1
(45) Date of Patent: May 29, 2001

(54) VEHICLE DIAGNOSING APPARATUS

(75) Inventors: Keiji Takakura, Saitama-ken; Hiroyuki Aiba, Tochigi-ken, both of (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/020,576

(22) Filed: Jan. 29, 1998

(30) Foreign Application Priority Data

Feb. 3, 1997 (JP) .................................................... 9-020336

(51) Int. Cl.$^7$ ................................................. G01M 15/00
(52) U.S. Cl. .............................................................. 73/116
(58) Field of Search ................................... 73/116, 117.1, 73/117.2, 117.3, 602, 423 A, 118.1, 865.9

(56) References Cited

U.S. PATENT DOCUMENTS

| | | | |
|---|---|---|---|
| 3,990,302 | * | 11/1976 | Reeves et al. ......................... 73/116 |
| 4,050,297 | * | 9/1977 | Pettingell et al. . |
| 4,567,756 | * | 2/1986 | Colborn ............................... 73/118.1 |
| 4,748,843 | * | 6/1988 | Schafer et al. ...................... 73/117.3 |
| 4,757,463 | * | 7/1988 | Ballou et al. ....................... 73/117.2 |
| 4,924,391 | * | 5/1990 | Hirano et al. ....................... 73/117.3 |
| 4,926,330 | * | 5/1990 | Abe et al. ............................ 73/117.2 |
| 5,296,869 | * | 3/1994 | Jonker et al. ....................... 73/117.3 |
| 5,369,991 | * | 12/1994 | Armstrong .......................... 73/119 A |
| 5,668,312 | * | 9/1997 | Kaman .................................... 73/116 |
| 5,705,743 | * | 1/1998 | Leonard et al. .................... 73/117.3 |
| 5,875,413 | * | 2/1999 | Vinci ..................................... 73/1.88 |
| 6,029,508 | * | 2/2000 | Schoenbeck et al. ................. 73/116 |

FOREIGN PATENT DOCUMENTS 7-52142    6/1995   (JP) .

* cited by examiner

Primary Examiner—Eric S. McCall
(74) Attorney, Agent, or Firm—Armstrong Westerman Hattori McLeland & Naughton, LLP

(57) ABSTRACT

A probe unit 4 which contains therein an A/D converter 41 is arranged to be connected to, and disconnected from, that connector 23 of a vehicle diagnosing unit 2 which is provided in order to connect the vehicle diagnosing unit 2 to an electronic control unit (ECU) of the vehicle. In this manner, it is so arranged that the diagnosing of electrical components of the vehicle can be performed by a probe 42.

3 Claims, 2 Drawing Sheets

VEHICLE DIAGNOSING APPARATUS

BACKGROUND OF THE INVENTION

1. Field of the Invention

The present invention relates to a vehicle diagnosing apparatus which diagnoses a vehicle, such as a motor vehicle, by communicating with an electronic control unit which is mounted on the vehicle.

2. Description of the Related Art

As this kind of vehicle diagnosing apparatus, there has hitherto been known one in, e.g., Japanese Published Examined Patent Application No. 52142/1995. Namely, the vehicle diagnosing apparatus is provided with a connector for connection to an electronic control unit (ECU) which is mounted on a vehicle. The vehicle is diagnosed by communicating with the electronic control unit via the connector. In this vehicle diagnosing apparatus, aside from the above-described connector, there is provided another connector for connecting or disconnecting a memory card. An analog/digital (A/D) converter is contained in the memory card, and probes are attached to the memory card. Analog signals from the probes are converted to digital signals by the A/D converter inside the memory card, and the digital signals are supplied to the vehicle diagnosing apparatus.

The vehicle diagnosing apparatus does not always require a memory card as an essential part or member. For example, if the data are communicated to and from a host computer, the memory card becomes needless. In the above-described conventional vehicle diagnosing apparatus, however, the memory card is equipped with the A/D converter and the probes. Therefore, even if the memory card can be eliminated or removed, the connector for the memory card must be maintained as it is. On the other hand, in case probes need be used in a vehicle diagnosing apparatus which is designed not to use a memory card, the vehicle diagnosing apparatus must be modified in order to newly provide it with a connector.

In view of the above-described problems, the present invention has an object of providing a vehicle diagnosing apparatus which can use a probe without additionally providing a connector which is exclusively used for the probe.

SUMMARY OF THE INVENTION

In order to attain the above and other objects, the present invention is a vehicle diagnosing apparatus comprising a connector which is connected to an electronic control unit mounted on a vehicle to thereby diagnose the vehicle by communicating with the electronic control unit via the connector, wherein the vehicle diagnosing apparatus further comprises a probe unit which is connected to, and disconnected from, the connector, which probe unit contains therein an analog/digital (A/D) converter for converting an analog signal to a digital signal, and which probe unit is provided with a probe to contact an electrical component of the vehicle, whereby an analog signal from the probe is supplied to the connector in a condition of being converted to a digital signal by the A/D converter.

Diagnosing which uses the probe like the diagnosing of electric components and diagnosing of the vehicle via the electronic control unit are not normally performed at the same time. Therefore, when the diagnosing by using the probe is performed, the connection to the electronic control unit of the vehicle is disconnected and, instead, the probe unit is connected to the connector which is otherwise used for connection to the electronic control unit. The analog signal from the probe is converted to the digital signal by the A/D converter and is transmitted to the vehicle diagnosing apparatus.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF PREFERRED EMBODIMENTS

Figure 1:
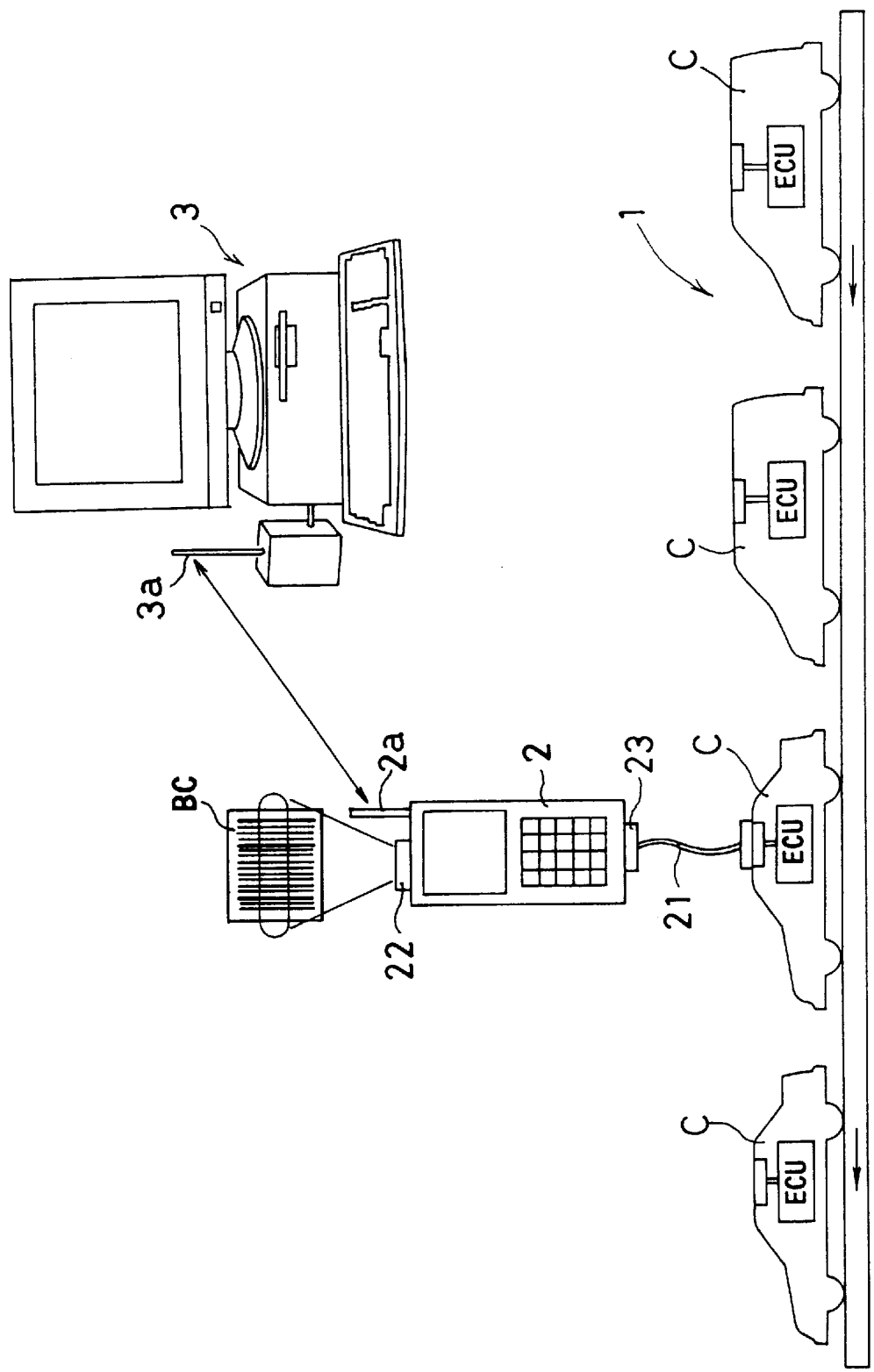
FIG. 1 is a schematic diagram showing the arrangement of a vehicle diagnosing line to which the vehicle diagnosing apparatus of the present invention is applied.

With reference to FIG. 1, reference numeral 1 denotes a vehicle diagnosing line on which the vehicles C each having mounted thereon an electronic control unit (ECU) are sequentially transported at a predetermined period. Reference numeral 2 denotes a portable diagnosing unit which is connected to the ECU of each vehicle C via a cable 21 which is plugged into a connector 23 provided in the diagnosing unit 2. Each vehicle C has attached thereto a bar code BC which shows the kind of the vehicle. The bar code BC is read by a scanning portion 22 which is provided in the diagnosing unit 2. Further, in the neighborhood of the vehicle assembly line 1, there is disposed a host computer 3 which bidirectionally communicates with the diagnosing unit 2, which transmits to the diagnosing unit 2 the data or the like required for the diagnosing of the vehicle, and which receives from the diagnosing unit 2 the result of diagnosing or the like. The bidirectional communication between the diagnosing unit 2 and the host computer 3 is performed via an antenna 2a which is disposed in the diagnosing unit 2 and an antenna 3a which is connected to the host computer 3.

Diagnosing of the vehicle is performed by communicating between the diagnosing unit 2 and the ECU of the vehicle. Among the items for diagnosing the vehicle, the diagnosing procedure for, e.g., an air/fuel ratio is described hereinbelow as an example.

The air/fuel ratio is diagnosed by sequentially performing the following four diagnosing function programs:

1. In the kind of vehicle in which two $O_2$ sensors for measuring the oxygen concentration in the exhaust gas are mounted, a confirmation is made that the testing of the first $O_2$ sensor has been completed.

2. A judgement is made of an air/fuel ratio (A/F judgement) by using the first $O_2$ sensor.

3. A confirmation is made that the testing of the second $O_2$ sensor has been completed.

4. A judgement is made of an air/fuel ratio (A/F judgement) by using the second $O_2$ sensor.

This kind of four independent diagnosing function programs are prepared in advance in the host computer 3 as modules in plural kinds. On the other hand, inside the diagnosing unit 2, there are stored or contained the diagnosing procedure for the above-described air/fuel ratio, as well as the diagnosing procedures for idling speed, vehicle speed, or the like depending on the kind of the vehicle.

When the diagnosing for the air/fuel ratio has begun, the above-described four diagnosing function programs are called up from the host computer 3 in the above-described order, whereby the diagnosing of the air/fuel ratio is performed.

The vehicle C is provided with various kinds of electrical components. Therefore, it is necessary to perform the diagnosing of these electrical components, aside from the diagnosing of the vehicle via the ECU. The diagnosing of these electrical components is performed by contacting a contact element called a probe with a terminal of each electrical component, whereby the potential of the terminal is measured. During the time when the electrical components are diagnosed by the probe, the diagnosing of the vehicle via the ECU is not performed. Therefore, it is so arranged that the cable 21 can be disconnected from the connector 23 and that a probe unit 4 can be connected to the connector 23, instead. Inside this probe unit 4 there is contained an A/D converter 41 which converts an analog signal to a digital signal. Further, a probe 42 and an grounding clip 43 are connected to the A/D converter 41. When the electrical components are diagnosed, the grounding clip 43 is connected to the body of the vehicle C and the probe 42 is brought into contact with the terminal of each electrical component. Then, there will occur a potential difference, which is an analog signal, between the probe 42 and the grounding clip 43. The A/D converter 41 converts this potential difference into a digital signal and transmits it to the diagnosing unit 2 via the connector 23. The diagnosing unit 2 then processes the digital signal therein to thereby indicate a terminal voltage of each electrical component.

Figure 2:
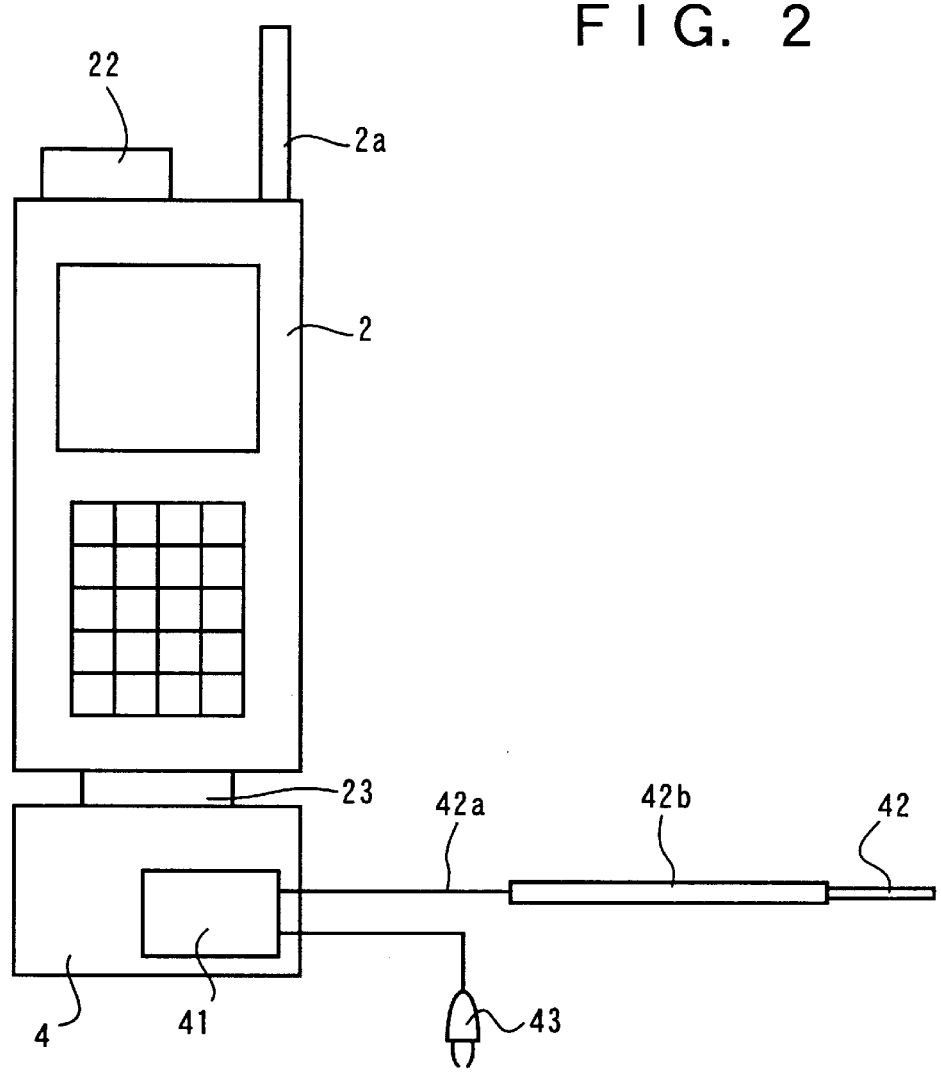
FIG. 2 is a schematic diagram showing the arrangement of one embodiment of the present invention.
Figure 3:
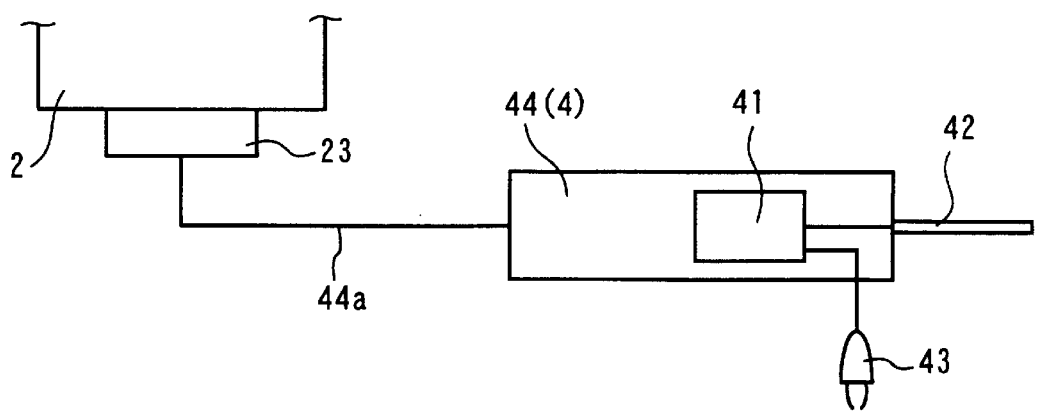
FIG. 3 is a schematic diagram showing the arrangement of another embodiment of the present invention.

In the embodiment shown in FIG. 2, the probe unit 4 is provided with a terminal portion (not illustrated) which is connected to the connector 23 of the diagnosing unit 2. The probe 42 with a grip portion 42*b* is connected to a cable 42*a* which extends from the probe unit 4. As still another embodiment, the following arrangement may also be made as shown in FIG. 3. Namely, the A/D converter 41 is contained inside a grip 44 to which the probe 42 is attached. In this manner, the grip 44 is made to serve as the probe unit 4, and the grip 44 is connected to the connector 23 of the diagnosing unit 2 via a cable 44*a*.

As can be seen from the above-described explanations, according to the present invention, the probe unit is connected to the connector which is provided in the diagnosing unit in order to connect the diagnosing unit to the ECU. Therefore, the probe can be used without additionally providing the diagnosing unit with a connector which is used exclusively for connecting the probe to the diagnosing unit.

It is readily apparent that the above-described vehicle diagnosing apparatus meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A vehicle diagnosing apparatus comprising:

a diagnosing unit;

a connector connecting said diagnosing unit to an electronic control unit mounted on a vehicle;

a probe unit having a probe and an analog to digital converter, said probe generating an analog signal upon contact of an electrical component of the vehicle, and said analog to digital converter converting said analog signal to a digital signal; and said connector connecting said diagnosing unit to said probe unit for supplying said converted digital signal to said diagnosing unit, when said connector is not connected to said electronic control unit.

2. A vehicle diagnosing apparatus according to claim 1, wherein said probe having a grip portion is connected to a cable which extends from said probe unit.

3. A vehicle diagnosing apparatus according to claim 1, wherein said probe unit is constituted by containing said analog to digital converter inside a grip having attached thereto said probe, and wherein said grip is connected to, and disconnected from, said connector by way of a cable.

* * * * *